(12) United States Patent  (10) Patent No.: US 9,118,289 B1
Fraley  (45) Date of Patent: Aug. 25, 2015

(54) HIGH TEMPERATURE MAGNETIC AMPLIFIERS

(71) Applicant: Arkansas Power Electronics International, Inc., Fayetteville, AR (US)

(72) Inventor: John Fraley, Fayetteville, AR (US)

(73) Assignee: Arkansas Power Electronics International, Inc., Fayetteville, AR (US)

( * ) Notice: Subject to any disclaimer, the term of this patent is extended or adjusted under 35 U.S.C. 154(b) by 168 days.

(21) Appl. No.: 13/891,787

(22) Filed: May 10, 2013

Related U.S. Application Data

(60) Provisional application No. 61/645,341, filed on May 10, 2012.

(51) Int. Cl.
   *H03F 9/00* (2006.01)
   *H03F 15/00* (2006.01)

(52) U.S. Cl.
   CPC . *H03F 15/00* (2013.01); *H03F 9/00* (2013.01)

(58) Field of Classification Search
   CPC .. G02B 6/0028; G02B 6/0011; G02B 6/0018; G02B 6/003; G02B 6/0031; G02B 6/0036; G02B 6/0068; G02B 6/0075; G02B 6/0076; G02B 6/0088; C04B 35/46; C04B 35/48; C04B 35/50; C04B 35/51; G01K 7/343; H01L 2924/0002; H01L 2924/00; A61B 5/411; A61B 5/0022; A61B 5/0002; H02M 3/33507; H05B 33/0815; H02J 7/025; H01F 38/14; Y02B 20/347; H03F 2200/03; H03F 1/0205; H03F 1/0294; H03F 2200/537; H03F 3/183; H03F 3/217; H03F 9/02
   USPC .......................... 330/8, 58, 60, 61 R, 62, 63
   See application file for complete search history.

(56) References Cited

U.S. PATENT DOCUMENTS

| | | | |
|---|---|---|---|
| 3,157,836 A * | 11/1964 | Jarvinen | 330/8 |
| 4,196,408 A | 4/1980 | Link | 336/94 |
| 4,445,095 A * | 4/1984 | Carver | 330/297 |
| 5,368,929 A | 11/1994 | Parker et al. | 428/305.5 |
| 8,390,373 B2 * | 3/2013 | Chen | 330/10 |
| 2010/0321106 A1 * | 12/2010 | Hsu et al. | 330/63 |

* cited by examiner

*Primary Examiner* — Khanh V Nguyen
(74) *Attorney, Agent, or Firm* — Baker & Hostetler LLP

(57) ABSTRACT

A high temperature magnetic amplifier, which utilizes the nonlinear properties of square loop magnetic cores to achieve very large amounts of both voltage and power amplification. By combining square loop, grain-oriented magnetic materials with high temperatures along with high temperature packaging approaches, high temperature long lifetime components can be produced. The high temperature magnetic amplifier is used as a building block to develop high temperature versions of operational amplifiers, comparators, voltage regulators, timers, counters, modulators, motor starters, servo systems, converters, inverters, power switches and many other devices.

1 Claim, 9 Drawing Sheets

HIGH TEMPERATURE MAGNETIC AMPLIFIERS

CROSS-REFERENCE TO RELATED APPLICATIONS

This application claims priority of U.S. Patent Application 61/645,341, filed May 10, 2012 entitled HIGH TEMPERATURE MAGNETIC AMPLIFIERS, which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in transformers for a wide range of electronic applications. The fields of use for this invention include Aerospace, Automotive, Power Generation, Power Distribution, Down Hole, Industrial Process, and any other field where high temperature, high reliability, high radiation, and/or high power electronics are needed. The present invention is specifically directed to transformers and electric circuits usable above 450 degrees Celsius. The fields of use for this invention include Aerospace, Automotive, Power Generation, Power Distribution, Down Hole, Industrial Process, and any other field where high temperature, high reliability, high radiation, and/or high power electronics are needed.

2. Description of the Known Art

As will be appreciated by those skilled in the art, low temperature transformers below 4350 degrees Celsius are known in various forms. Patents include U.S. Pat. No. 4,196,408, issued to Link on Apr. 1, 1980 entitled High temperature transformer assembly; and U.S. Pat. No. 5,368,929, issued to Parker, et al. on Nov. 29, 1994 High temperature insulation for liquid-filled transformers. Each of these patents is hereby expressly incorporated by reference in their entirety.

Magnetic amplifiers were invented early in the 20th century, and found use in a wide range of electronics applications until the advent of the transistor. Magnetic amplifiers were used in high power and high reliability applications instead of vacuum tubes for their scalability and mechanical ruggedness. Some magnetic amplifiers achieved voltage gains of over a million, and many different systems utilized them as a basic building block. After the invention of the transistor, the magnetic amplifier was largely forgotten, except for a few special cases such as high power regulators on switching converters.

SUMMARY OF THE INVENTION

The present invention teaches the construction of high temperature, above 450 degree Celsius capable, magnetic amplifiers and associated circuitry. The purpose of this invention is to serve as a high temperature electronic device in a wide range of electronic applications.

The present invention began with the search for ferro-resonant transformers to use in high temperature voltage regulators for telemetry applications. These did not exist. Transformers with heat shields and heat sinks were available, but none of them could operate at the temperatures necessary for our applications. Thus, began the process of creating a high temperature magnetic amplifier structure. Upon realizing its potential applicability to the world of high temperature electronics, the engineers set out to invent a high temperature version of the device. By combining high curie temperature magnetic alloys with high temperature packaging approaches and processes, along with other advanced materials such as SiC rectifiers, the inventors created several high temperature versions of the magnetic amplifier device. Such amplifiers are directly relevant to applications in both high power and wireless extreme environment electronics.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
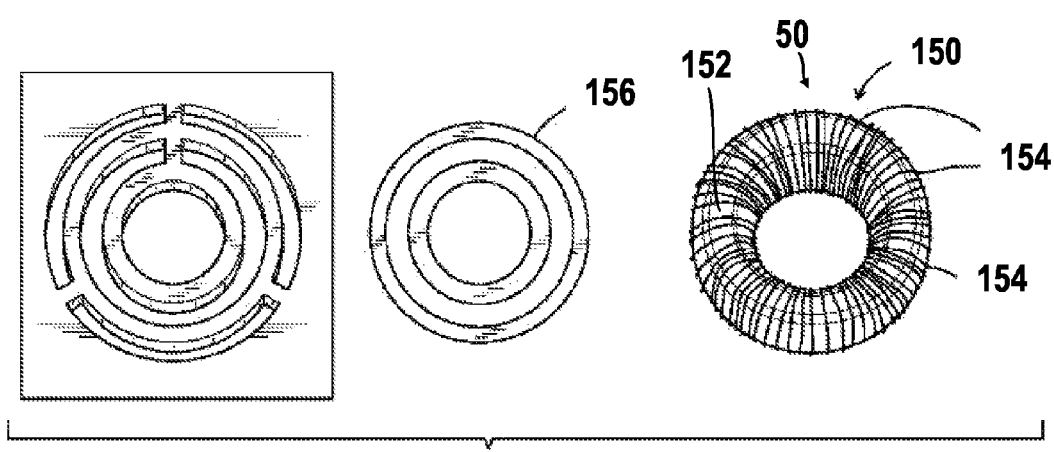
FIG. 1 shows a high temperature magnetic amp fabrication.

The key component of a magnetic amplifier is the saturable core reactor 50, which can serve to control the inductance of the core windings via a DC or low frequency AC signal. The problem is doing this in a high temperature environment such as that above 450 degrees Celsius. The present invention utilizes one of several saturable core materials 152 that have been identified to provide the required properties at elevated temperatures in combination with a ceramic coated high temperature magnet wire 154 and a low temperature co-fired ceramic toroid case 156. FIG. 1 shows the LTCC case in fabrication and the method in which the toroid cases were constructed, the fabricated case 156 after it has been fired, and the toroidal reactor 150. The magnet wire 154 used for the windings is ceramic coated nickel clad copper from California Fine Wire, Inc. Once the toroid structures were fabricated, much effort was placed into how to wind the ceramic coated magnet wire around the cores. The wire is very fragile, as the ceramic insulation is un-fired, and can easily flake off until the wire has been cured, which must take place after winding, because the cured ceramic cannot flex.

Commercially available core materials that have promise for high temperature saturable reactor devices are grain-oriented rectangular-hysteresis loop nickel iron, silicon steel, and iron-cobalt alloys being particularly attractive. Table 1 shows some of the core materials selected for use in 450° C.+magnetic amplifiers.

| Trade Name | Composition | Saturated Flux Density Tesla | DC Coercive Force amp-turn/cm | Squareness Ratio | Curie Temperature Celsius |
|---|---|---|---|---|---|
| SUPERMENDUR PERMENDUR | 49% Co 49% Fe 2% V | 1.9-2.2 | 0.18-0.44 | 0.9-1.0 | 930 |
| MAGNESIL SILECTRON MICROSIL SUPERSIL | 3% Si 97% Fe | 1.5-1.8 | 0.5-0.75 | 0.75-0.85 | 750 |
| DELTAMAZ ORTHONOL 49 SQ MU | 50% Ni 50% Fe | 1.4-1.6 | 0.125-0.25 | 0.94-1.0 | 500 |
| ALEEGHENY 4750 48 ALLOY CARPENTER 49 | 48% Ni 52% Fe | 1.15-1.4 | 0.062-0.187 | 0.8-0.92 | 480 |
| 4-79 PERMALLOY PERMALLOY 80 SQ MU 79 | 79% Ni 17% Fe | 0.66-0.82 | 0.025-0.82 | 0.8-1.0 | 460 |

Another very important characteristic for saturable reactors is that they have an effective air gap as small as possible, in order not to shear over the hysteresis loop, causing it to lose its squareness. The amplification properties of the core relate to the slope of the permeability, and as such, when the hysteresis loop is sheared over, the amplifying effects are lessened. This leads to one of the difficulties of the physical saturable reactor/magnetic amplifier construction. Since the effective airgap must be minimized a closed magnetic path should be maintained, meaning that the usual interleaving technique for transformer core construction is often not adequate for magnetic amplifiers, due to the air gaps present at the joints. For this invention, the preferred method is the use of either tape wound toroid cores or closed path punched laminations.

Figure 2:
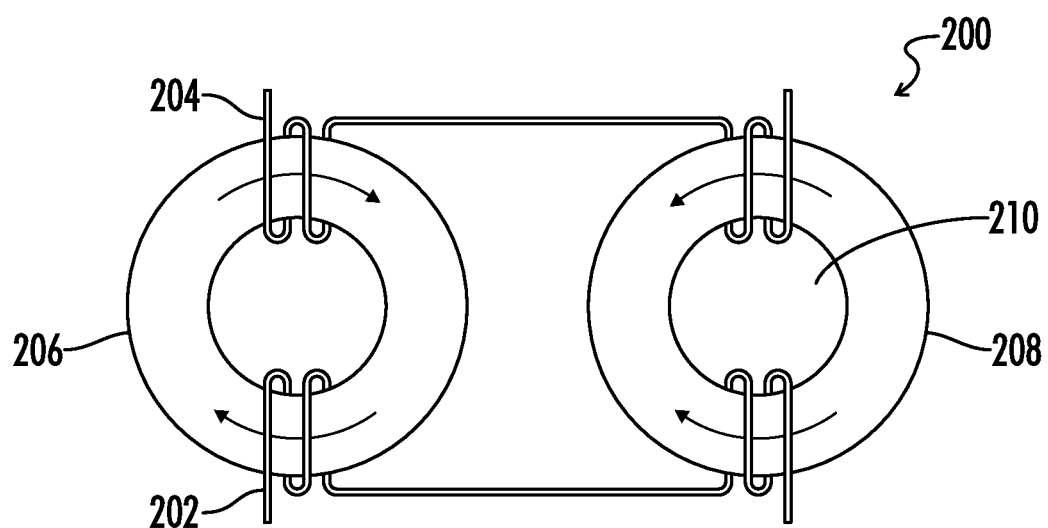
FIG. 2 shows a method for winding magnetic amplifier coils that prevents ac coupling into the control windings.

As shown in FIG. 2, the arrangement of the windings upon a saturable reactor 200 also greatly affects the performance of the magnetic amplifier. In addition to the aforementioned control and load windings, other windings such as bias, feedback, sensing, and other special purpose windings can be included in the basic magnetic amplifier structure, but must be done so in a way that leakage effects are reduced to a minimum, and more importantly, in a way that prevents the circulation of disturbing AC currents of the fundamental frequency in the DC bias, control, and feedback windings. These currents can be induced by transformer action from AC components of currents flowing in the load winding if proper designs are not employed. As shown in FIG. 2, one of the ways to minimize these induced currents is to wind the control windings 202, and other DC windings, such as bias and feedback, in series-aiding, with the AC load windings 204 being wound in series-opposition. Although this configuration yielded very good results for the initial saturable reactor system investigated, there are two drawbacks to this approach. The first one is obvious, in that two separate cores first core 206, second core 208 are needed, requiring a larger volume to implement. The second, not so obvious, drawback is that when the number of control windings Nc is much larger than the number of load windings NL, very large voltages are induced on the control windings through transformer action, and although they are cancelled out, the large voltages require thicker insulation, which takes up precious window area 210 within the cores.

Figure 3:
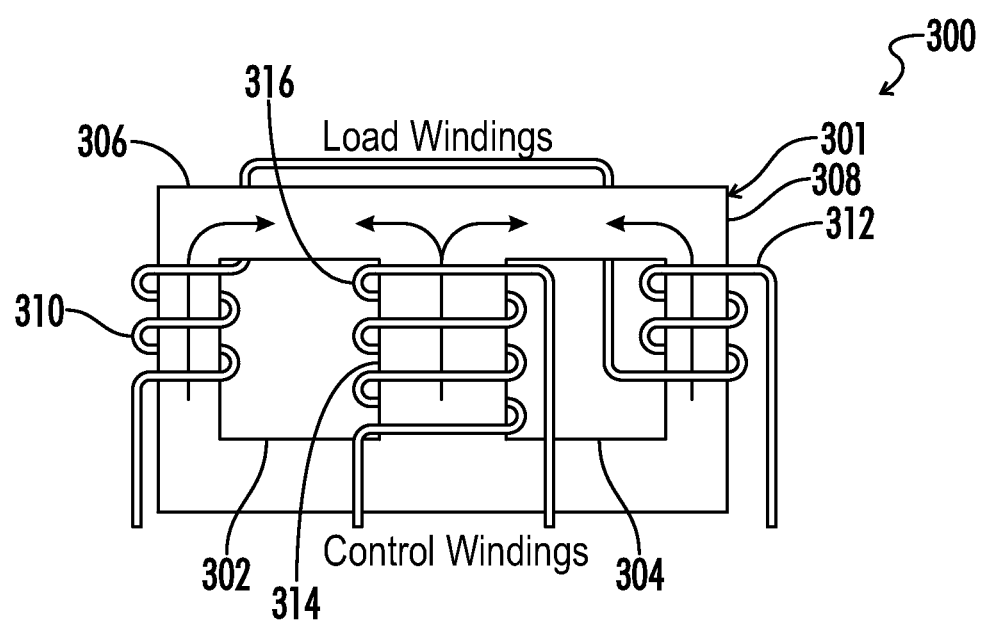
FIG. 3 shows a double window core reactor.

A solution to both of these drawbacks is presented in FIG. 3, which eliminates these problems. In this configuration, a double window core reactor 300 utilizes a double window core 301 which has a first window 302 and second window 304 stamped into it which yields a first outer core leg 306, and a second outer core leg 308 one on each side, for the first outer load winding 310 and second outer load winding 312, while the center core leg 314, which is twice the width of the outer legs houses a single control winding 316. Hence, one core is used, an entire control winding is eliminated, and the flux from the load windings is cancelled out, and therefore large voltages are never induced on the control windings.

Figure 4:
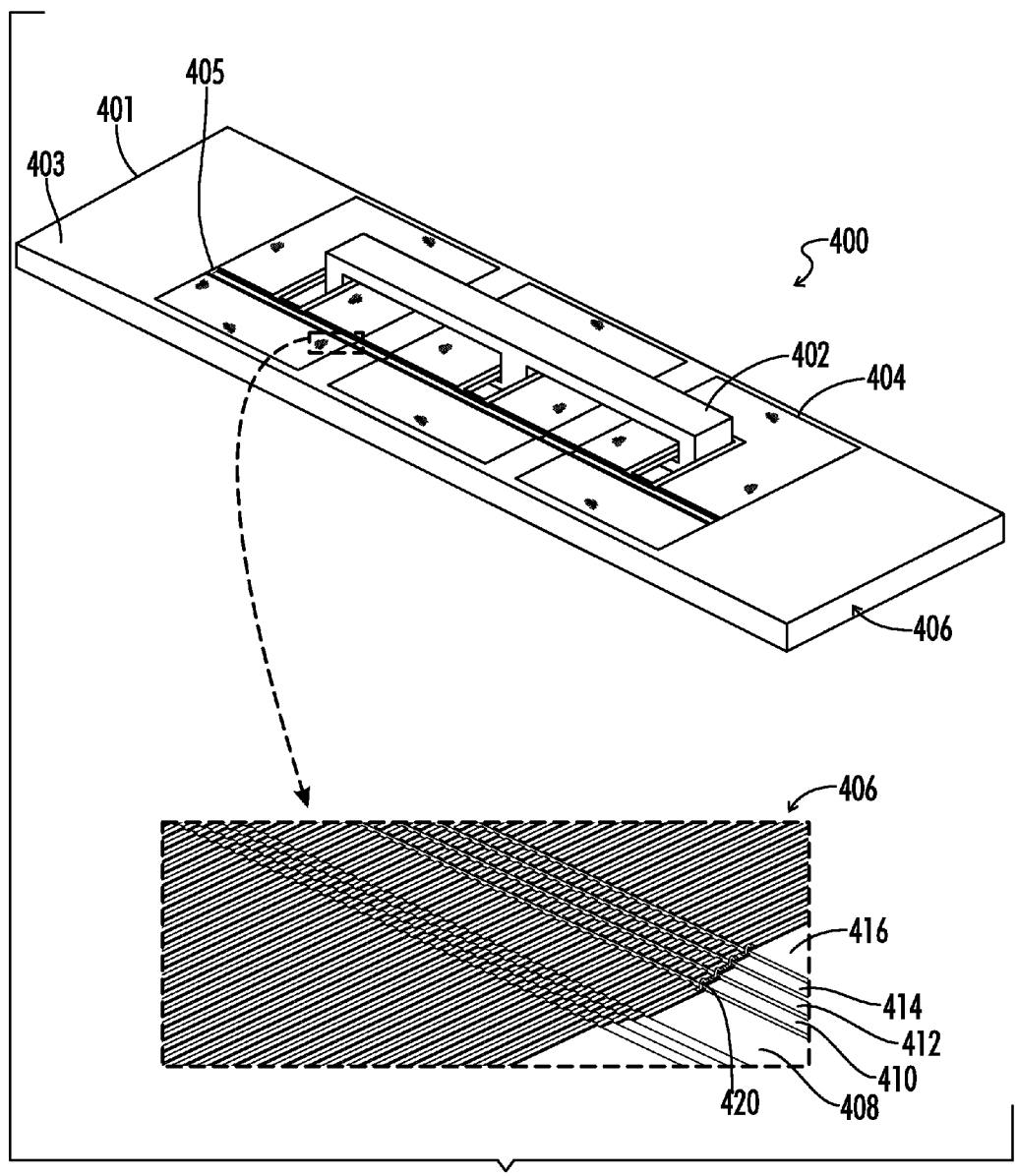
FIG. 4 shows a method for thick film integration.

FIG. 4 shows one approach to integrating the magnetic structures in a thick film system 400. By reorienting the magnetic core 402, the windings 404 can be made in a planar fashion on a multi-layer LTCC substrate 406, allowing for more than an adequate amount of turns. FIG. 4 shows a first layer 408, second layer 410, third layer 412, fourth layer 414 and fifth layer 416. With this approach, the substrate is actually made in two pieces. Once the core 402 is inserted into the back portion 401 of the substrate 406, the front portion 403 of the substrate can be brazed in place to form the complete substrate 406. The electrical connections are then completed via a simple wire bonding procedure across the joint 405. By using a step back 418 for each layer to the next, one can layer the wire bonds 420 in a stepped manner and all of the electrical layers 408, 410, 412, 414, 416 can be connected with very short wire bonds 420.

Figure 5:
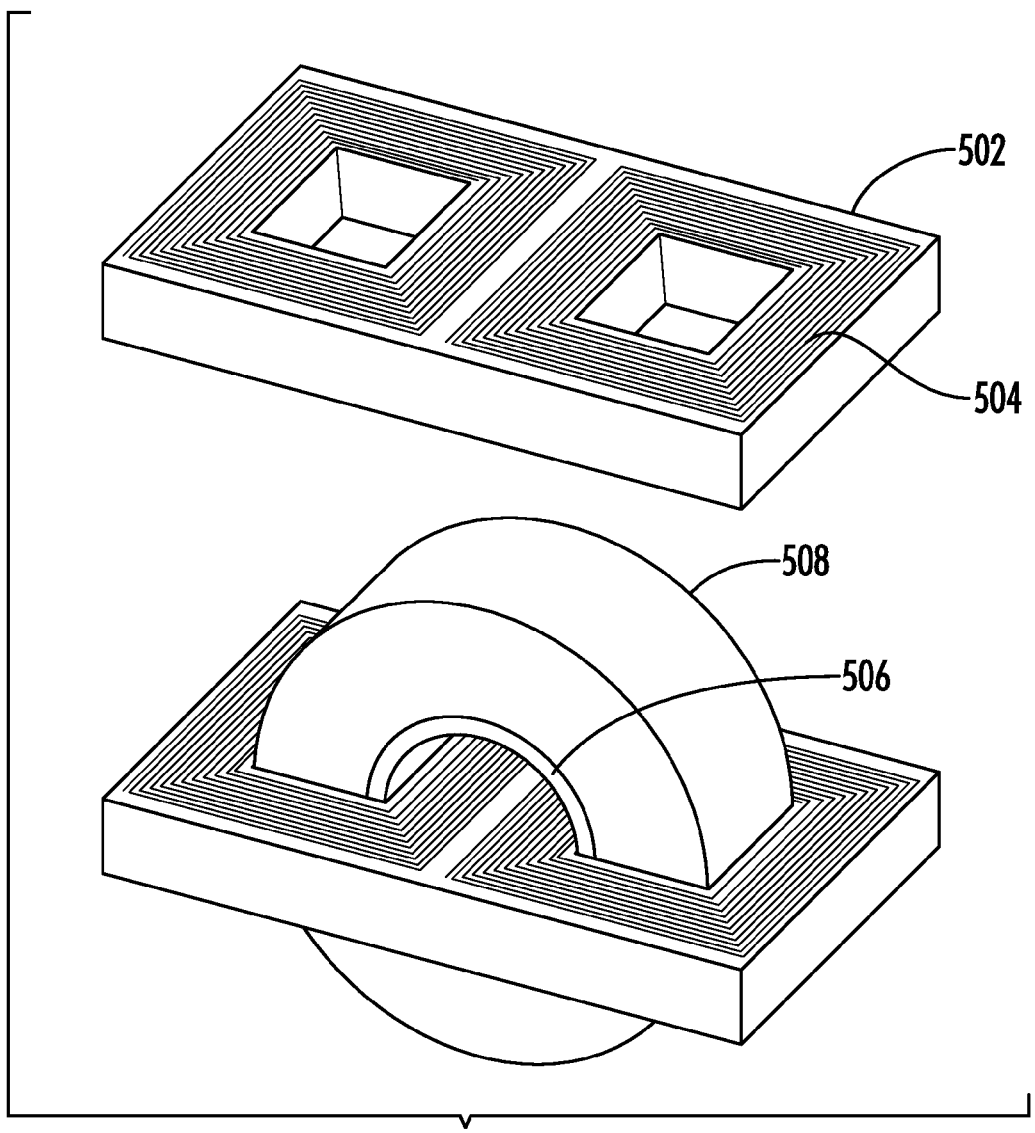
FIG. 5 shows a secondary method for thick film integration.

FIG. 5 shows an alternative approach to integrating the magnetic structures 500 in a thick film system. In this concept, the substrate 502 can be manufactured in a single piece, again with planar windings 504 that can be stacked through many layers. Once the LTCC substrate has been fired, a split ceramic bobbin 506 is placed around the windings. After the split bobbin is in place, the magnetic tape 508 is wound around the bobbin 506, creating a toroidal magnetic structure which yields a completely closed magnetic path, FIG. 5, bottom. With suitable fixturing, the process can be automated for precise and repeatable magnetic components, which can yield magnetic devices that are almost completely free from mechanical degradation, resulting in extremely long lifetime magnetic amplifier systems.

Figure 6:
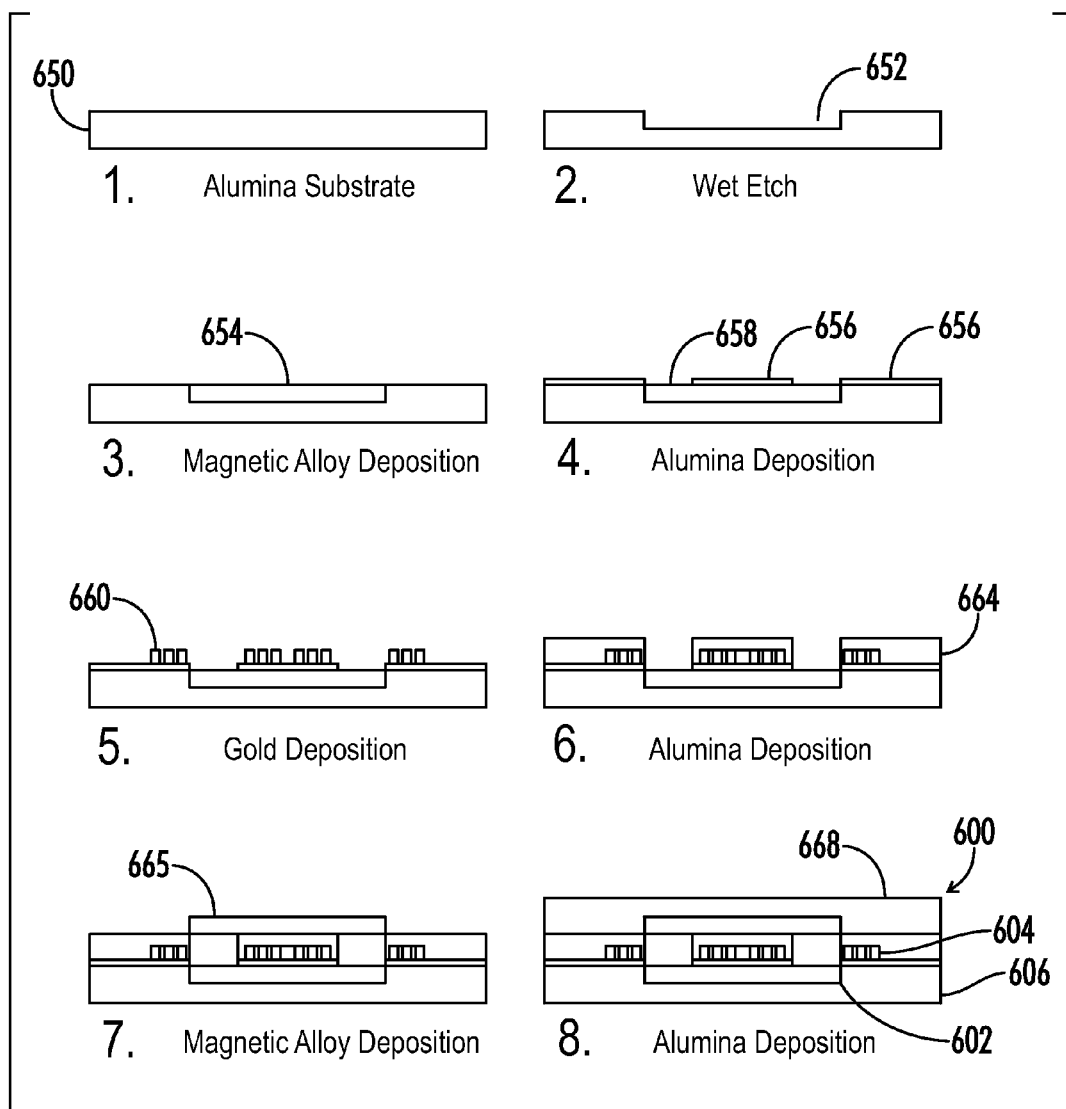
FIG. 6 details the high-level processing steps for thin film magnetic amplifier structures.

FIG. 6 shows yet another approach for extremely reliable integrated magnetic devices that are also extremely miniaturized. By implementing magnetic structures 600 in a thin-film process, both the magnetic cores 602 and their associated windings 604 can be fabricated on the same substrate 606, with multiple structures on a single chip. The end result can be a full telemetry system that fits into a volume of less than a dime, allowing high temperature, high reliability systems to be placed in space limited areas, allowing for a virtually unlimited number of sensing applications. The thin film process obviously lends itself to mass production manufacturing, driving the cost for full telemetry systems down even further. Another benefit of thin film magnetics is that they can allow for very high frequency magnetics to be employed, yielding benefits to magnetic amplifier systems such as extremely fast response times.

FIG. 6 details the high-level processing steps for thin film magnetic amplifier structures, although there are many other ways to implement such a system. To begin with, an alumina substrate 650 is wet-etched with sodium hydroxide to form an aperture 652. After the alumina has been etched to a suitable depth, a thin film metal adhesion layer, such as 500 angstroms titanium followed by 500 angstroms tungsten, is sputtered onto the etched trench, and then the magnetic alloy 654 is electroplated up to the desired thickness. Following this initial electroplating, an insulating layer 656 of alumina is sputtered or flame-sprayed onto the magnetic alloy 654, leaving two spaces 658 un-coated for further plating for the core. Once the alumina insulator has been deposited, another adhesion layer is sputtered onto the alumina, along with a high conductivity metal 660 such as gold. These steps are repeated until the desired number of high conductivity windings 662 has been deposited. After this step, a winding cap 664 of alumina is deposited onto the windings to encapsulate them, at which point the core top 665 of the magnetic alloy is further electroplated up to yield a closed magnetic structure forming the core 602. A final top cap 668 deposition of alumina provides protection to the plated magnetic alloy. Further enhancements to the magnetic structure can be added, such as depositing the magnetic alloy as a series of thin laminations to further increase the frequency capabilities of the devices.

Figure 7:
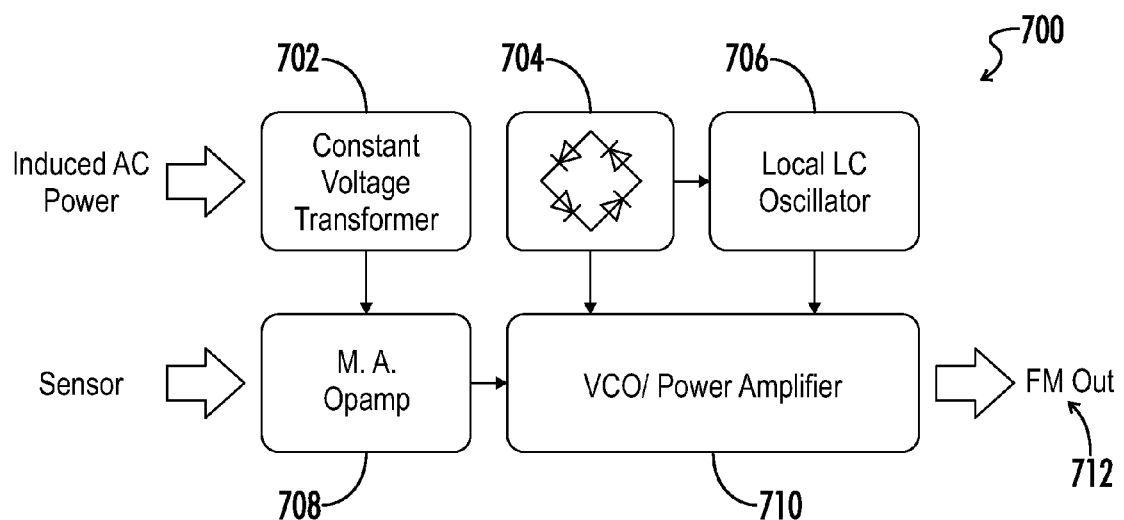
FIG. 7 shows a block diagram depicting the components needed for a high temperature telemetry system.

FIG. 7 shows a block diagram depicting the components needed for a high temperature telemetry system 700, including magnetic amplifiers to provide all of the signal conditioning operations. Although it is true that the high temperature magnetic amplifier can find use in nearly all high temperature electronics areas, the focus of the research proposed here is to utilize the newly developed technology in conjunction with high temperature sensors. The synthesis of a truly reliable high temperature sensing system will allow for great returns on safety for aerospace personnel, reduced emissions through smart control of turbines, and dramatic cost savings for aerospace and land based turbine systems. As such, the system design in this research targets one of the harshest environments high temperature electronics can be exposed to—the gas turbine rotor and blade. For sensor systems to deliver useful data from a turbine blade in a typical natural gas power generation turbine, the systems must be capable of simultaneous operation at temperatures >450° C. and g-loads >10,000 g's, and must be fully wireless because no power can be wired in to the rotating components without drastically reducing rotor lifetimes. These systems must also survive harsh thermal cycling conditions during turbine startup and shutdown. Furthermore, for turbine sensor systems to actually be used in field operation, the systems must be robust enough to last for years in operation, as they are effectively useless in predictive health maintenance if they fail before the part they are expected to be monitoring.

For turbine blade instrumentation, power is delivered to the electronics via induced power. Static coils line the stator, and transmit AC power to a power pickup coil next to the transmitter electronics on the blade neck. Using the high temperature transformers, this design can completely eliminate the need for transistors, with the exception of the RF portions which require only three devices total. Commercially available GaN transistors can be used for the RF components. As noted previously, magnetic amplifier based systems require AC voltage to function, which is actually ideal in this type of system, wherein AC power is the only power available for the wireless system in the first place. In turbine applications, induced AC power varies in amplitude, as changes in loading and temperatures within the turbine cause the rotor to expand and contract, resulting in a power signal that must be regulated. In the old transistor based systems, an incredibly stable DC regulation is required, as the operating points of the discrete JFET devices in the amplifier are very sensitive to voltage variation. In contrast, the present invention's magnetic based operational amplifiers simply require modest AC voltage regulation, which can be achieved with the use of a constant voltage transformer, CVT, also referred to as a ferro-resonant transformer 702.

Once the induced AC has been regulated through the CVT, a portion of the AC power is delivered to the magnetic amplifier based opamp 708. The sensor signal delivered to the input of the opamp is electrically isolated from the rest of the opamp, which provides several advantages over transistor based counterparts. One of these advantages is that very good signal resolution can be achieved in comparison to the transistor based system. In the transistor system, induced AC power needs to be rectified, then tightly regulated and filtered, since a low level sensor signal's full output range could be swamped out through variations caused by loose regulation or through AC ripple. In the case of even a simple saturable reactor system, it is simply the DC sensor input that serves to saturate the reactor cores. Perhaps even more important is the ability to introduce closed loop compound feedback in a magnetic opamp, which has not been possible to do using discrete transistor designs. This will truly revolutionize the capabilities of high temperature electronics systems, as constant gain vs. temperature systems can be achieved, which means that these systems can be mass-produced, since individual tuning and calibration vs. temperature can be eliminated.

The remaining blocks in the sensor system 704, 706, 710, 712 are comprised of the RF circuitry, including a rectifier 704, oscillator 706, and amplifier 710 required to create a carrier signal 712, and modulate the sensor information onto that signal. This can be done through the implementation of an LC oscillator 706 built around GaN transistors, which are actually commercially available devices. The theoretical operating temperature of GaN is above that of SiC, coming in at around 650° C. We have built RF circuitry out of these devices that have operated in a lab environment up to 550° C., and testing was limited to the temperature of the test setup itself. Good DC power can be delivered to the RF blocks simply by implementing a GaN bridge rectifier 704 between the CVT 702 and the RF blocks.

Once the basic core materials and winding configurations are successfully implemented, basic circuit structures can then actually be fabricated. One of these structures, using only the two core saturable reactor, is a voltage variable inductor, wherein the variable inductance is placed into an LC oscillator, and the frequency of that oscillator was made to vary with the sensor output. However, with a few additional elements, many, many more circuit structures can be implemented.

Figure 8:
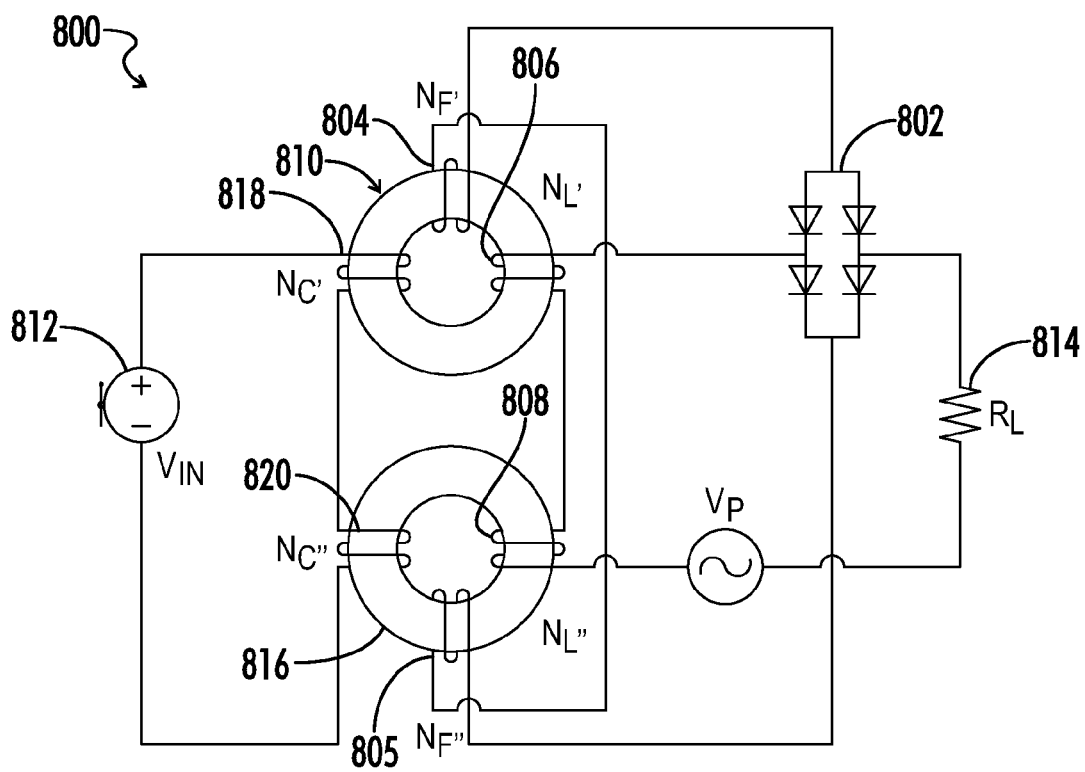
FIG. 8 shows a magnetic amplifier 800 that utilizes a bridge rectifier 802 to provide DC feedback into a tertiary feedback winding 804, resulting in extremely large gains.

FIG. 8 shows a magnetic amplifier 800 that utilizes a bridge rectifier 802 to provide DC feedback into a tertiary feedback winding 804, resulting in extremely large gains. Thus demonstrating the additional elements that can be implemented. The most important of the additional elements is the rectifier 802, which is actually quite a mature technology in both SiC and GaN, as it is already used in commercial applications for power electronics systems. The first application of the rectifier 802 is to turn the AC current in the load windings 806, 808 into a DC current that can be used further down the electrical system, such as for servo drives or non-feedback based comparators. The more exciting feature that rectifiers 802 allow is the ability to apply feedback to the saturable reactor 810. In this manner, a DC control voltage can produce an appreciable AC gain in the load winding, and a portion of the AC current in the load winding can be rectified and fed back across a tertiary feedback winding of the reactor, which when properly implemented can result in incredibly large voltage, current, or power gains from the magnetic amplifier structure. FIG. 8 displays a circuit diagram wherein windings Nc1 818, NLI 806, and NF1 804 are the control, load, and feedback windings on a single first saturable core 806, while Nc2 820, NL2 808, and NF2 805 are windings on a second saturable core 816. The amplifier circuit 800 consists of these windings, an AC source 812, a load resistor 814, and a rectifier 802. The rectifier 802 converts the AC current going through the load windings 806, 808 into a DC current that can be made to flow through the feedback windings 804, 805. Depending on the relative number of turns of the feedback and load windings, it is possible to provide 100 percent feedback, based on ampere-turns rather than current, by means of external feedback.

In previous low temperature magnetic amplifiers, practical gains of over one million have been realized with this type of structure. Although this type of amplifier can provide a large amount of gain, it does not influence the effective input impedance of the control circuit, and the resistance seen by a sensor would only be that of the control windings themselves, and any series resistance added to the control windings. Adding resistance in series, however, simply reduces the current through the windings, so the gain of the circuit is decreased dramatically. By adding a fourth winding, compound-feedback can be implemented, which can lead to a magnetic amplifier based op-amp, with characteristics approaching that of an ideal amplifier. This component could perhaps be the most important part of a sensor telemetry system; as such a device can provide precise, constant gain and high common-mode rejection.

Figure 9:
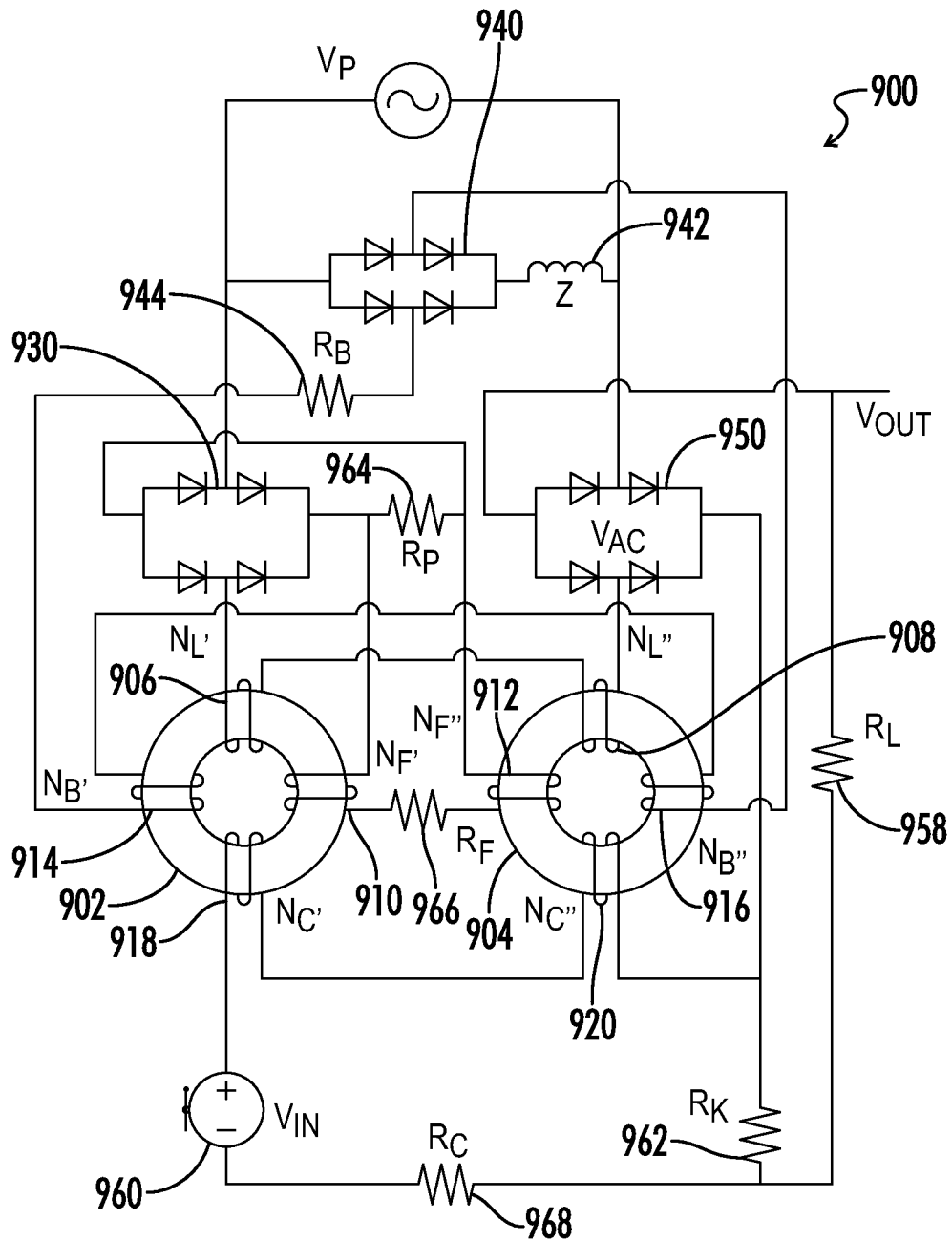
FIG. 9 shows a single-ended self-balancing magnetic amplifier 900, which presents a high input and low output impedance, as well as very high gain.

FIG. 9 shows a single-ended self-balancing magnetic amplifier 900, which presents a high input and low output impedance, as well as very high gain. The basic design of a single-ended, self-balancing magnetic amplifier is depicted in FIG. 9, which shows a system of first core 902 and second core 904 with each having a load winding 906, 908, feedback winding 910, 912, bias winding 914, 916, and control winding 918, 920 such that each core has four windings per core. The circuit amplifier 900 also uses three bridge rectifiers 930, 940, 950. The load windings NL are wound in series aiding, while the feedback, bias, and control windings, NF, NB, and Ne, are wound in series-opposing, such that any voltages induced by the AC supply Vp are opposed. The load resistor RL 958, the series resistor RK 962, and the feedback windings NF with a regeneration control shunting resistor Rp are supplied by two separate full-wave bridge rectifiers. The bias windings NB carry current from a third full-wave bridge rectifier with a series impedance Z 942 and a DC series resistor RB 944. The bias current produces additional DC magnetization which is opposing to the magnetization produced by the feedback windings NF, and independent of the control current flowing through control windings Ne. The basic idea behind this circuit is to use compound feedback of both magnetic and electric coupling. The magnetic feedback in this case is positive feedback, which produces an effectively infinite gain inside the reactors, while negative electrical feedback is achieved by resistance-coupling a portion of the load current into the control circuit loop. When high permeability core materials are used, the total ampere-turns of the load windings NL are equal to the total ampere-turns of the control windings Ne and the feedback windings NF. When the input signal VIN 960 is applied to the control windings, the load current IL increases such that a voltage drop takes place across the resistor RK 962. The polarity of VIN 960 opposes an increase in load current IL, and the resistor RK exercises a controlling effect on the load current. If positive feedback is used, and the resistors are selected, a large gain with extreme stability, a linear input-output characteristic, and a high speed response can be achieved. Additionally, the input current required from the sensor is extremely small, as the sensor sees very high effective input impedance looking into the control windings. Another important aspect of this amplifier is that, unlike the amplifier depicted in FIG. 8, the gain is made independent of the number of control windings, and over certain ranges, variations in the supply voltage amplitude and frequency, and variations of the value of the load RL, have a minimal effect the voltage ratio, which is what is required of an ideal amplifier.

What is claimed is:

1. A saturable core magnetic amplifier circuit comprising:
an input signal;
a first control winding in series with a second control winding, a series resistor, and the input signal;
the first control winding wound around a first core;
the second control winding wound around the second core;
a first load winding wound around the first core;
a first bridge rectifier electrically connected to the first load winding;
a second load winding wound around the second core;
a second bridge rectifier electrically connected to the second load winding;
a first feedback winding wound around the first core, the first feedback winding electrically connected to the first bridge rectifier;
a second feedback winding wound around the second core, the second feedback winding electrically connected to the first bridge rectifier;
a feedback resistor connected between the first feedback winding and the second feedback winding;
a first bias winding wound around the first core, the first bias winding connected to a second bridge rectifier;
a second bias winding wound around the second core, the second bias winding connected to the second bridge rectifier; and
a third bridge rectifier connected to the second load winding, the second control winding.

* * * * *